(12) United States Patent
Iacopi et al.

(10) Patent No.: US 8,685,877 B2
(45) Date of Patent: Apr. 1, 2014

(54) DOPING OF NANOSTRUCTURES

(75) Inventors: Francesca Iacopi, Leuven (BE);
Philippe M. Vereecken, Liège (BE)

(73) Assignee: IMEC, Leuven (BE)

( * ) Notice: Subject to any disclaimer, the term of this patent is extended or adjusted under 35 U.S.C. 154(b) by 986 days.

(21) Appl. No.: 11/960,653

(22) Filed: Dec. 19, 2007

(65) Prior Publication Data

US 2010/0096618 A1   Apr. 22, 2010

Related U.S. Application Data

(60) Provisional application No. 60/876,856, filed on Dec. 22, 2006.

(30) Foreign Application Priority Data

May 11, 2007 (EP) .................................. 07009495

(51) Int. Cl.
| | | |
|---|---|---|
| *B01J 21/00* | (2006.01) | |
| *B01J 23/04* | (2006.01) | |
| *B01J 21/02* | (2006.01) | |
| *B01J 27/00* | (2006.01) | |
| *B01J 27/02* | (2006.01) | |
| *B01J 23/06* | (2006.01) | |

(52) U.S. Cl.
USPC ........... 502/100; 438/478; 977/762; 977/775; 502/355; 502/344; 502/340; 502/353; 502/349; 502/208; 502/202; 502/216; 502/343; 502/337; 502/352; 257/14

(58) Field of Classification Search
USPC .......... 423/348, 349, 350, 324; 205/656, 674, 205/686; 502/214, 100, 355, 344, 340, 353, 502/202, 349, 208, 216, 343; 977/721, 742; 257/14

See application file for complete search history.

(56) References Cited

U.S. PATENT DOCUMENTS

| | | | |
|---|---|---|---|
| 5,314,569 A | | 5/1994 | Pribat et al. |
| 6,157,043 A | * | 12/2000 | Miyamoto ...................... 257/22 |

(Continued)

FOREIGN PATENT DOCUMENTS

| | | |
|---|---|---|
| EP | 0 443 920 A1 | 2/1991 |
| EP | 1 696 473 A2 | 8/2006 |
| WO | WO 2006/016914 A2 | 2/2006 |
| WO | WO 2006/078281 A3 | 7/2006 |

OTHER PUBLICATIONS

WO2006/087841, Osaka University, Titanium Oxide Nanotube, Aug. 24, 2006.*

(Continued)

*Primary Examiner* — Milton I Cano
*Assistant Examiner* — Sarah A Slifka
(74) *Attorney, Agent, or Firm* — Knobbe Martens Olson & Bear LLP

(57) ABSTRACT

A catalyst particle for use in growth of elongated nanostructures, such as e.g. nanowires, is provided. The catalyst particle comprises a catalyst compound for catalyzing growth of an elongated nanostructure comprising a nanostructure material without substantially dissolving in the nanostructure material and at least one dopant element for doping the elongated nanostructure during growth by substantially completely dissolving in the nanostructure material. A method for forming an elongated nanostructure, e.g. nanowire, on a substrate using the catalyst particle is also provided. The method allows controlling dopant concentration in the elongated nanostructures, e.g. nanowires, and allows elongated nanostructures with a low dopant concentration of lower than $10^{17}$ atoms/cm$^3$ to be obtained.

32 Claims, 4 Drawing Sheets

(56) References Cited

U.S. PATENT DOCUMENTS

| | | | |
|---|---|---|---|
| 7,161,286 B2* | 1/2007 | Liu et al. | 313/311 |
| 7,662,355 B2 | 2/2010 | Kamisako et al. | |
| 2005/0195472 A1* | 9/2005 | Tang | 359/333 |
| 2006/0060863 A1* | 3/2006 | Lu et al. | 257/77 |
| 2006/0231381 A1* | 10/2006 | Jensen et al. | 204/157.47 |
| 2007/0037365 A1* | 2/2007 | Ranganath et al. | 438/478 |

OTHER PUBLICATIONS

Derwent 2005-539396, Actuator element used in medical equipment, has conductive material with composite structure of carbon nanotube doped with metal ions and solid electrolye, K.Asaka, Feb. 6, 2004.*

Greytak, et al. Growth and transport properties of complementary germanium nanowire field-effect transistors. Applied Physics Letters (May 24, 2004), vol. 84, No. 21, 4176-4178.

Liu, et al. Synthesis of doped ZnS one-dimensional nanostructures via chemical vapor deposition. Materials Letters 60 (2006) 3471-3476.

Piccin, et al. Growth by molecular beam epitaxy and electrical characterization of GaAs nanowires. Physica E 37 (2007) 134-137.

Wang, et al. Use of Phosphine as an n-Type Dopant Source for Vapor-Liquid-Solid Growth of Silicon Nanowires. Nano Letters 2005 vol. 5, No. 11, 2139-2143.

* cited by examiner

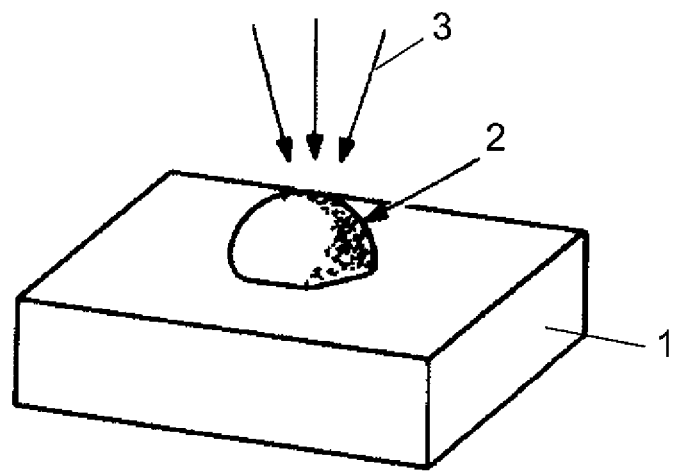
FIG. 1A – PRIOR ART
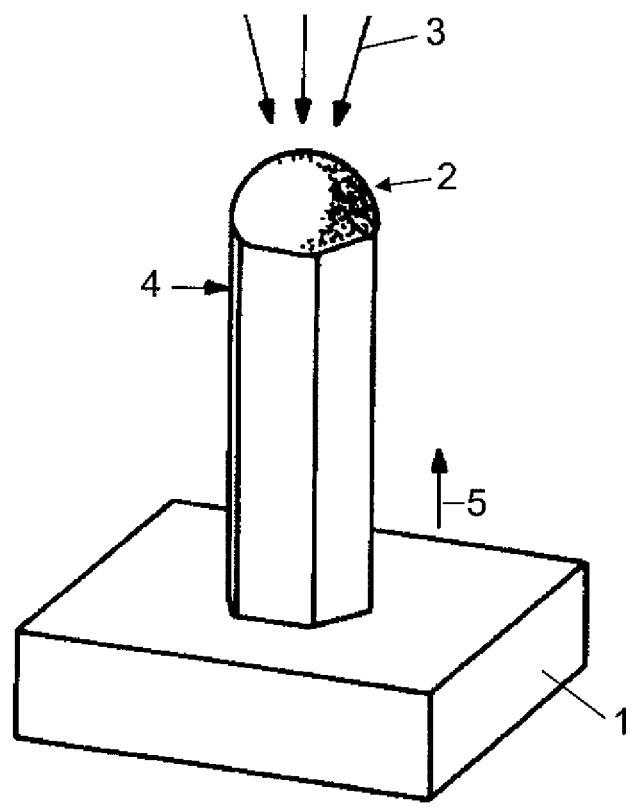
FIG. 1B – PRIOR ART

DOPING OF NANOSTRUCTURES

CROSS-REFERENCE TO RELATED APPLICATIONS

This application claims the benefit under 35 U.S.C. §119 (e) of U.S. provisional application Ser. No. 60/876,856, filed Dec. 22, 2006, and claims the benefit under 35 U.S.C. §119 (a)-(d) of European application No. EP 07009495.8, filed May 11, 2007, the disclosures of which are hereby expressly incorporated by reference in their entirety and are hereby expressly made a portion of this application.

FIELD OF THE INVENTION

The present invention relates to growth and doping of nanostructures, e.g. nanowires. More particularly the present invention relates to a catalyst particle comprising a catalyst compound and at least one dopant element, to a method for forming elongated nanostructures using such a catalyst particle, to doped elongated nanostructures formed by the method according to preferred embodiments and to devices comprising such doped elongated nanostructures.

BACKGROUND OF THE INVENTION

In the field of molecular nano-electronics, semiconductor nano-crystals, nanowires (NWs) and carbon nanotubes (CNTs) are becoming more and more important as components for various electronic devices. These NWs and CNTs are unique for their size, shape and physical properties and have, depending on their electrical characteristics, been used in electronic devices such as e.g. diodes and transistors. Although a lot of progress has been made on both fabrication and understanding of the limits of performance of these NWs and CNTs, there are still key issues to be addressed for potential technological applications. For example, there are still important limitations in processes for doping the NWs and CNTs, which would be required when incorporating such NWs or CNTs in various electronic devices.

Synthesis and doping of p- and n-type germanium (Ge) NWs using gas-phase dopants such as phosphine and diborane has been demonstrated by Greytak et al. in Appl. Phys. Lett. 84 (21), 2004, p. 4176. Intrinsic growth of Ge NWs from gold nanoclusters is initiated at 320° C. and 500 Torr using 1.5% germane ($GeH_4$) in an atmosphere of hydrogen ($H_2$). Elongation of the NW structures is carried out at a reduced temperature of 285° C. After growth, the NW surfaces are doped at 380° C. with either phosphine or diborane in the absence of germane. The doping conditions are chosen to produce a self-limited layer of activated dopant atoms as estimated from atomic-layer-doping studies on planar SiGe. However, with the method described above it is difficult to control the dopant concentration and it may be difficult to obtain low dopant concentrations of lower than $10^{17}$ atoms/$cm^3$ in the NWs.

In US 2006/0234519 A1 plasma ion implantation immersion (PIII) is used to dope nanowires and other nano element-based devices on substrates. For example, a method for doping portions of at least one nanowire on a specimen is disclosed which generally comprises enclosing the specimen in a chamber, wherein the specimen includes at least one nanowire thereon having at least one exposed portion, coupling an electrical potential to the specimen; and sourcing a plasma into the chamber, the plasma including ions of a doping material whereby the ions from the plasma implant the at least one exposed portion of the at least one nanowire. However, doping of the nanowires is not performed during growth and thus is difficult to control. This is because it is difficult to implant the whole length of the nanowires due to geometry limitations (small diameter in the order of a few nm and high aspect ratio).

Dilts et al. (Materials Research Society Symposium Proceedings Vol. 832, 2005, pp. 287-292) fabricated high density boron-doped silicon NW arrays within pores of anodized alumina membranes using vapor-liquid-solid (VLS) growth. Boron-doped silicon NWs were synthesized within the pores by VLS growth using silane ($SiH_4$) and trimethylboron (TMB) gas sources. Cui et al. (The Journal of Physical Chemistry, Volume 104, Number 22, Jun. 8, 2000) described the use of laser catalytic growth to controllably introduce either boron or phosphorus dopants during the vapor phase growth of silicon NWs.

However, adding dopant gases such as trimethylboron (TMB) gas to the reaction chamber can cause deformation of the catalyst particle used to catalyze NW growth. Deformation of the catalyst particle may have an effect on the diameter of the nanowire and may, for example, lead to a higher diameter than was required. Furthermore, it is difficult to control the dopant concentration and to obtain low dopant concentrations of lower than $10^{17}$ in the nanowire.

SUMMARY OF THE INVENTION

A method of providing good catalyst particles and a good method for forming doped elongated nanostructures, e.g. nanowires, using such catalyst particles is desirable.

By use of catalyst particles and of the method according to the preferred embodiments, elongated nanostructures, e.g. nanowires, may be obtained with a dopant concentration of lower than $10^{17}$ atoms/$cm^3$.

Furthermore, the use of catalyst particles and of the method according to preferred embodiments makes it possible to control dopant concentration of the elongated nanostructure, e.g. nanowire, throughout the elongated nanostructure, e.g. nanowire.

Moreover, the use of catalyst particles and of the method according to preferred embodiments allows forming elongated nanostructures, e.g. nanowires, having a dopant concentration profile or a variation of dopant concentration along their length.

The use of catalyst particles and the method according to preferred embodiments can be used to prepare to elongated nanostructures, e.g. nanowires, which are uniformly doped and wherein the dopant has no influence on physical properties, such as e.g. diameter, of the elongated nanostructure, e.g. nanowire.

The above advantages may be obtained by a method and device according to the preferred embodiments.

In a first aspect, a catalyst particle is provided. The catalyst particle comprises: a catalyst compound for catalyzing growth of an elongated nanostructure comprising a nanostructure material without substantially dissolving or without significantly dissolving in the nanostructure material, and at least one dopant element for doping the elongated nanostructure during growth by substantially completely dissolving in the nanostructure material.

With "without substantially dissolving" is meant that less than 1% of the catalyst compound dissolves into the nanostructure material, more preferred at most a few atoms dissolve. With "substantially completely dissolving" is meant that more than 90% of the at least one dopant element, preferably more than 95% of the at least one dopant element and more preferably more than 99% of the at least one dopant element is dissolved in the elongated nanostructure obtained.

The catalyst compound may comprise at least one catalyst compound element. According to preferred embodiments, the catalyst compound and the at least one dopant element may comprise different elements.

According to preferred embodiments, the catalyst particle may comprise more than one dopant element.

The at least one dopant element may have a high solubility in the elongated nanostructure, e.g. nanowire. Most preferred, the solubility of the dopant element in the nanostructure material may be in the order of at least a solubility of $10^{19}$ atoms/cm$^3$ or higher, preferably a solubility of $10^{20}$ atoms/cm$^3$ or higher and most preferably a solubility of $10^{21}$ atoms/cm$^3$ or higher.

The catalyst compound comprising at least one catalyst element may have a low solubility in the material of the nanostructure. Most preferred, the solubility of the catalyst compound in the nanostructure material may be in the order of a solubility of $10^{18}$ atoms/cm$^3$ or lower, more preferably a solubility of $10^{16}$ atoms/cm$^3$ or lower, still more preferably a solubility of $10^{14}$ atoms/cm$^3$ or lower and most preferably a solubility of $10^{12}$ atoms/cm$^3$ or lower.

Most preferred, the solubility of the at least one dopant element in the nanostructure material may be at least one order of magnitude higher than the solubility of the catalyst compound in the nanostructure material.

The catalyst compound, the at least one dopant element and the nanostructure material may preferably have a low eutectic temperature of 600° C. or lower.

According to preferred embodiments, the catalyst compound may comprise at least one catalyst element selected from In, Tl, Au, Zn, Bi, Co or Ni.

According to preferred embodiments, the at least one dopant element may be a p-type dopant element. Preferably, the p-type dopant element may comprise one of B, Al, Ga, Mg, Zn, Be, Sr, Ba or C.

According to other preferred embodiments, the at least one dopant element may be an n-type dopant element. Preferably, the n-type dopant element may comprise one of Li, Sb, As, P, Si, Ge, S, Sn or Te.

Preferably, the elongated nanostructure may be a nanowire, preferably a semiconductor nanowire. According to preferred embodiments, the semiconductor nanowire may comprise a semiconductor material comprising at least one of a group IV element (such as Si, Ge) or a binary compound thereof (e.g. SiGe), a group III element (such as B, Al, Ga, In, Tl) or group V element (such as N, P, As, Sb) and binary, tertiary or quaternary compounds thereof, a group II element (such as Cd, Zn) or a group VI element (such as O, S, Se, Te) and binary, tertiary or quaternary compounds thereof.

According to most preferred embodiments, the semiconductor nanowire may comprise a semiconductor material comprising at least one of silicon (Si), germanium (Ge) or silicon-germanium (SiGe). The dopant element may be a p-type dopant comprising at least one of B or Al or may be an n-type dopant element comprising at least one of Li, Sb, P or As. The catalyst compound may, for example, be selected from a suitable material to catalyze vapor-liquid-solid (VLS) growth such as In, Tl, Au, Zn, Te and Bi.

The preferred embodiments also provide the use of catalyst particles according to preferred embodiments in growth processes of doped elongated nanostructures, e.g., nanowires.

The preferred embodiments further provide the use of catalyst particles according to preferred embodiments in manufacturing of devices comprising doped elongated nanostructures, e.g. nanowires. The devices may be, for example, semiconductor devices, sensors, micro-electro-mechanical systems (MEMS), and the like.

In a further aspect, a method is provided for forming at least one doped elongated nanostructure, e.g. nanowire, on a substrate. The method comprises: providing at least one catalyst particle on the substrate, the catalyst particle comprising a catalyst compound and at least one dopant element, and growing the at least one elongated nanostructure, e.g. nanowire, comprising a nanostructure material from the at least one catalyst particle, hereby using the catalyst compound for catalyzing growth of the at least one elongated nanostructure without substantially dissolving in the nanostructure material, and the at least one dopant element for doping the at least one elongated nanostructure, e.g. nanowire, during growth by substantially completely dissolving in the nanostructure material.

The method according to preferred embodiments may lead to elongated nanostructures, e.g. nanowires, which are homogeneously doped, i.e. doped such that the at least one dopant element are dispersed in a microscopically homogeneous manner. This means that atoms of the at least one dopant element are homogeneously distributed in the finite volume of the elongated nanostructure.

The catalyst compound may comprise at least one catalyst element. Providing the catalyst particle may, according to preferred embodiments, be performed such that the catalyst compound and the at least one dopant element comprise different elements. The catalyst compound may have a solubility in the nanostructure material of $10^{18}$ atoms/cm$^3$ or lower, more preferably a solubility of $10^{16}$ atoms/cm$^3$ or lower, still more preferably a solubility of $10^{14}$ atoms/cm$^3$ and most preferably a solubility of $10^{12}$ atoms/cm$^3$ or lower. The at least one dopant element may have a solubility in the nanostructure material of $10^{19}$ atoms/cm$^3$ or higher, preferably a solubility of $10^{20}$ atoms/cm$^3$ or higher and most preferably a solubility of $10^{21}$ atoms/cm$^3$ or higher.

According to preferred embodiments, the elongated nanostructure may be formed of a nanostructure material and providing the catalyst particle may be such that the catalyst compound comprises at least one element native to the nanostructure material.

According to preferred embodiments, the method may furthermore comprise changing or varying a growth rate of the elongated nanostructure during growth. The higher the growth rate, the higher the concentration of the at least one dopant element in the nanostructure, e.g. nanowire, may be. Therefore, a combination of choice of the at least one dopant element and growth rate may define the dopant concentration and, where desired, a combination of choice of the at least one dopant element and variation of the growth rate during growth may define a dopant profile along the length of the elongated nanostructure, e.g. nanowire. Varying or changing the growth rate, i.e. decreasing or increasing the growth rate during growth, may be performed by changing growth parameters of the growth process, such as temperature and/or gas flow.

Preferably, the at least one elongated nanostructure may be a nanowire, most preferably a semiconductor nanowire. The semiconductor nanowire may comprise at least one of a group IV element or a binary compound thereof, a group III element or group V element or binary, tertiary or quaternary compounds thereof, a group II element or a group VI element or binary, tertiary and quaternary compounds thereof. Most preferably, the semiconductor nanowire may comprise one of Si, Ge or SiGe.

The preferred embodiments further provide a doped elongated nanostructure formed by the method according to preferred embodiments. The doped elongated nanostructure may have a length and may show a dopant concentration profile or a variation in dopant concentration along its length.

Further, the preferred embodiments provide a device comprising at least one doped elongated nanostructure formed by the method according to preferred embodiments. The device may, for example, be a semiconductor device, a sensor, a micro-electro-mechanical system (MEMS), and the like.

The at least one doped elongated nanostructure in the device may have a length and may show a dopant concentration profile or a variation of dopant concentration along its length.

Particular and preferred aspects are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the preferred embodiments will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 1A and FIG. 1B schematically illustrate the growth of a silicon single crystal using the Vapor Liquid Solid (VLS) mechanism according to the prior art.

Figure 2:
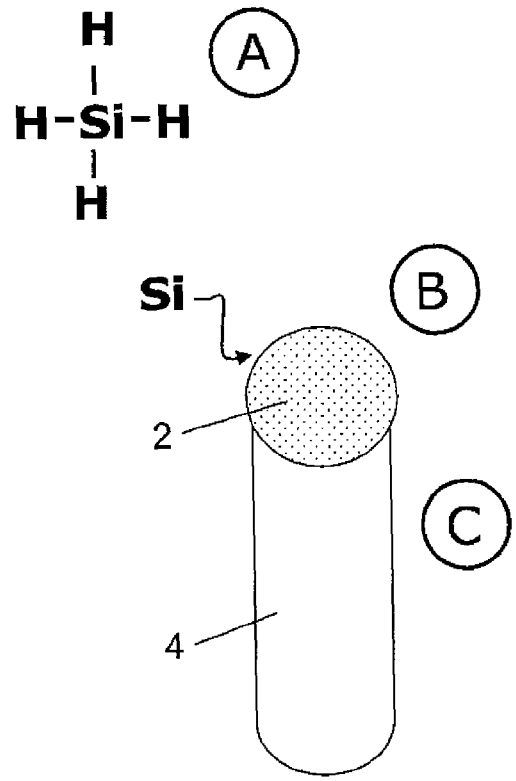
FIG. 2 illustrates catalyzed nanowire growth based on the VLS technique for forming monocrystalline silicon nanowires.

In the different figures, the same reference signs refer to the same or analogous elements.

DETAILED DESCRIPTION OF THE PREFERRED EMBODIMENT

Preferred embodiments will be described with respect to particular embodiments and with reference to certain drawings but the invention is not limited thereto but only by the claims. The drawings described are only schematic and are non-limiting. In the drawings, the size of some of the elements may be exaggerated and not drawn to scale for illustrative purposes. The dimensions and the relative dimensions do not correspond to actual reductions to practice of the invention.

Furthermore, the terms first and second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the preferred embodiments described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof.

The following terms are provided solely to aid in the understanding of the preferred embodiments.

The term "catalyst compound" used herein refers to a compound comprising at least one catalyst element for catalyzing elongated nanostructure growth without substantially or significantly dissolving in material of the elongated nanostructure.

The terms "dopant" or "dopant element" used herein refer to an element for doping the elongated nanostructure during growth by substantially completely dissolving in the material of the elongated nanostructure.

The term "nanostructure material" used herein refers to material of which the elongated nanostructures are made.

Whenever reference is made hereinafter to a particular dopant type, this is not intended to limit the preferred embodiments. It is to be understood that in the examples given herein below, materials and dopant types may be replaced by other suitable materials and dopant types, without changing the invention.

The invention will now be described by a detailed description of several preferred embodiments. It is clear that other preferred embodiments can be configured according to the knowledge of persons skilled in the art without departing from the true spirit or technical teaching of the invention, the invention being limited only by the terms of the appended claims.

In particular, preferred embodiments will be described with reference to elongated nanostructures. The term elongated nanostructures is meant to include any two-dimensionally confined pieces of solid material in the form of wires (nanowires), tubes (nanotubes), rods (nanorods) and similar elongated substantially cylindrical or polygonal nanostructures having a longitudinal axis. A cross-dimension of the elongated nanostructures preferably lies in the region of 1 to 500 nanometers. According to preferred embodiments, organic elongated nanostructures, such as e.g. carbon nanotubes (CNTs), or inorganic elongated nanostructures, such as e.g. semiconducting nanowires (e.g. silicon nanowires) may be used.

According to the preferred embodiments, examples of elongated nanostructures are semiconducting nanowires, however, this is not intended to be limiting, and is intended to encompass any example of an elongated nanostructure, which may include nanorods, nanowhiskers and other elongated nanostructures.

The preferred embodiments will be described by means of growth of elongated nanostructures using Vapor-Liquid-Solid (VLS), also referred to as metal catalyzed nanostructure growth. The VLS technique as described by Wagner et al. in 'Applied Physics Letters, Vol. 4, Nr. 5, March 1964, pp.

89-90' is schematically illustrated in FIGS. 1A and 1B. A gold catalyst particle is provided on a [111] silicon substrate 1 (see FIG. 1A). The gold particle is heated up to 950° C. such that a small liquid droplet 2 of Si—Au alloy (catalyst nanoparticle) attached to the substrate 1 is formed. The material to form the nanostructure 4 from is provided in gaseous form, indicated by the arrows with reference number 3. For example, in case of silicon carbide nanostructures 4 to be formed, a methane bearing gas and a silicon bearing gas may be used for growing the nanostructure 4 in a direction, indicated by reference number 5, substantially perpendicular to a plane of the substrate 1 (see FIG. 1B). The resulting nanostructure 4 has the liquid droplet 2 (catalyst nanoparticle) on top.

An example of VLS growth of silicon nanowires 4 using silane as a source gas is illustrated in FIG. 2. The VLS growth comprises mainly three steps (A-C) which are continuously repeated. To create, for example, Si nanowires 4 as in the example given, a first VLS step (A) is a chemical dissociation of the source gas, in the example given silane $SiH_4$, which is catalyzed by the catalyst nanoparticle 2. Next, the dissociated silane is transported towards the catalyst nanoparticle 2 (liquid). A second step in VLS growth (B) is then eutectic alloy formation between the dissociated silicon source (gas) and the catalyst nanoparticle 2. In a third step (C) the silicon is precipitated such as to form a nanowire 4 (solid).

It is understood that the use of VLS to grow elongated nanostructures is not intended to be limiting in any way and that other suitable techniques for growing elongated nanostructures may also be used in the method according to preferred embodiments, such as e.g. catalytic chemical vapor deposition (CCVD), Vapor-Solid-Solid (VSS), floating reactant method, and the like.

At least some preferred embodiments are concerned with the problem of achieving low dopant levels or dopant element concentrations in the elongated nanostructures, i.e. dopant concentrations of lower than $10^{17}$ atoms/$cm^3$. Methods available in prior art for providing dopant elements to elongated nanostructures, such as directional implantation of at least one dopant element after growth of the nanostructures or adding at least one gas phase dopant element during growth of the nanostructures, suffer from the problem of limited control on dopant element concentration in the elongated nanostructure. Furthermore, using these prior art methods, a uniform dopant distribution throughout the nanostructure as well as very low dopant element concentrations, i.e. lower than $10^{17}$ atoms/$cm^3$, in the nanostructure are difficult to achieve.

Therefore, the preferred embodiments provide a catalyst particle comprising a catalyst compound for catalyzing growth of elongated nanostructures comprising nanostructure material, without substantially dissolving in the nanostructure material, and at least one dopant element for doping the elongated nanostructures during growth by substantially completely dissolving in the nanostructure material.

The preferred embodiments also provide a method for forming at least one doped elongated nanostructure on a substrate using catalyst particles according to preferred embodiments. The method comprises first providing at least one catalyst particle on the substrate, the catalyst particle comprising a catalyst compound and at least one dopant element, and subsequently growing the at least one elongated nanostructure comprising nanostructure material from the at least one catalyst particle, hereby using the catalyst compound for growth of the at least one elongated nanostructure without significantly dissolving in the nanostructure material and the at least one dopant element for doping the at least one elongated nanostructure during growth by substantially completely dissolving in the nanostructure material.

By use of catalyst particles and of the method according to preferred embodiments, elongated nanostructures, e.g. nanowires, may be obtained with a dopant concentration of lower than $10^{17}$ atoms/$cm^3$. The solubility of the at least one dopant element in the material of the nanostructure may depend on the temperature. For elements with a lower solubility, i.e. a solubility of $10^{18}$ atoms/$cm^3$ or lower, in the material of the elongated nanostructure the solubility may strongly depend on the temperature. For elements with a higher solubility, i.e. a solubility higher than $10^{18}$ atoms/$cm^3$, in the material of the elongated nanostructure the solubility is less dependent on the temperature. This can be seen from FIG. 4 which shows solid solubility of different elements as a function of temperature.

Furthermore, the use of catalyst particles and of the method according to preferred embodiments makes it possible to control dopant concentration of the elongated nanostructure, e.g. nanowire, throughout the elongated nanostructure, e.g. nanowire.

Moreover, the use of catalyst particles and of the method according to preferred embodiments allows forming elongated nanostructures, e.g. nanowires, having a dopant concentration profile or a variation of dopant concentration along its length.

The use of catalyst particles and the method according to preferred embodiments may lead to elongated nanostructures, e.g. nanowires, which are uniformly doped and wherein the dopant element has no influence on physical properties, such as e.g. diameter, of the elongated nanostructure, e.g. nanowire.

Figure 3:
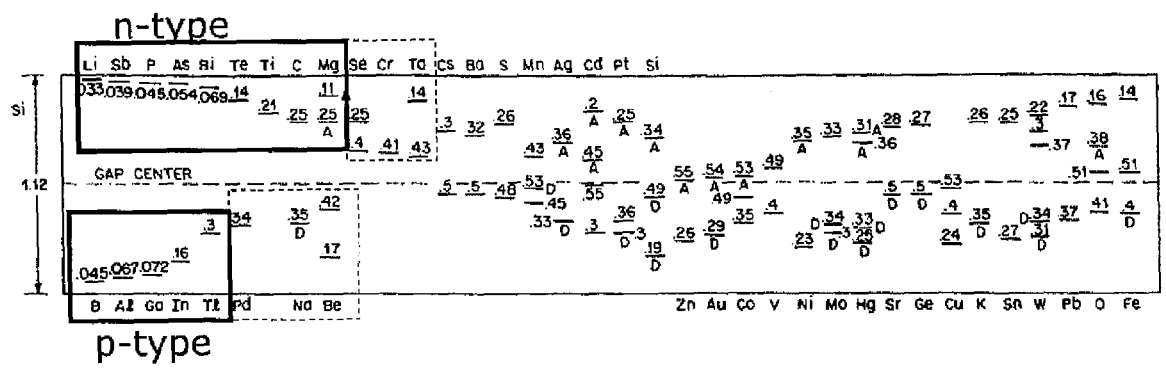
FIG. 3 illustrates possible donor (n-type) and acceptor (p-type) dopant elements which are suitable for incorporation in silicon semiconductor nanowires from electronic point of view.

Doping of the elongated nanostructure may be done by an n-type or a p-type dopant element, depending on the application the elongated nanostructure will be intended for. As an example, FIG. 3 illustrates examples of possible donor (n-type) and acceptor (p-type) dopant elements which may be suitable for incorporation in silicon semiconductor nanowires from electronic point of view. Silicon has a bandgap of 1.12 eV. FIG. 3 illustrates the bandgap shift in the silicon material caused by the electrically activated impurities or dopants. Elements leading to a bandgap difference smaller than 0.1 eV may be suitable for use either as p-type or n-type dopant. Form FIG. 3 it can be seen that suitable n-type dopants for Si may, for example, be Li, Sb, P, As, Bi, Te, Ti, C or Mg. Suitable p-type dopants for Si may, for example, be B, Al, Ga, In, Tl.

Figure 4:
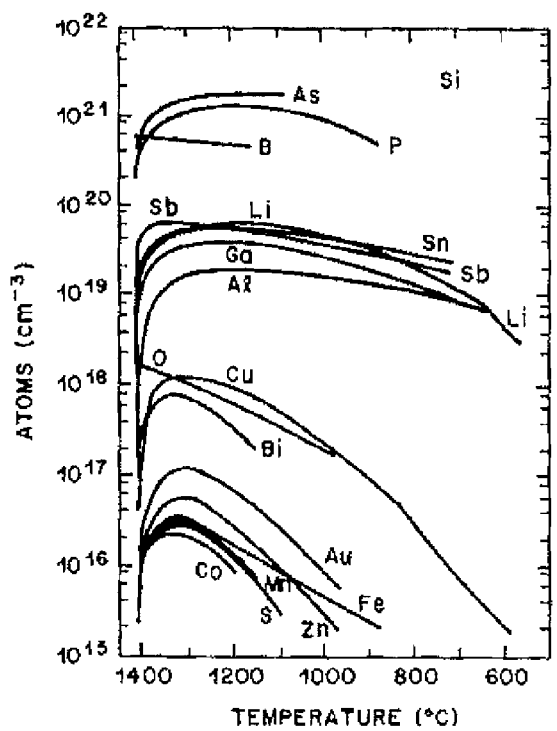
FIG. 4 illustrates solid solubility of impurity elements in silicon.

For illustration purposes, FIG. 4 illustrates solid solubility as a function of temperature for impurity elements which can be taken into account for being used as dopants in silicon. This figure originates from the handbook "VLSI technology" by S. M. Sze, 1983. FIG. 4 shows the maximum concentrations of dopant elements that can be achieved for silicon, for different dopant elements. To obtain high dopant concentration levels, for example, a solubility of at least $10^{19}$ atoms/$cm^3$ may be required. To obtain dopant levels lower than $10^{19}$ atoms/$cm^3$, dopant elements with a lower solubility may be used. Hence, from FIG. 4 a suitable dopant element can be chosen to be used with the method according to preferred embodiments for obtaining an elongated nanostructure with a required dopant level.

According to preferred embodiments, doping of an elongated nanostructure may be performed during, for example, VLS growth using a catalyst particle wherein the catalyst compound and the at least one dopant element comprise different elements. The catalyst compound is used to catalyze VLS growth of the elongated nanostructure and the at least one dopant element, which may be a p-type or an n-type dopant element, is used for doping the elongated nanostructure during growth.

During VLS growth of the elongated nanostructure the at least one dopant element(s) substantially completely dissolves in the material of the elongated nanostructure. With "substantially completely dissolves" is meant that more than 90% of the at least one dopant element, preferably more than 95% of the at least one dopant element and more preferably more than 99% of the at least one dopant element is dissolved in the elongated nanostructure obtained. Therefore, preferably the at least one dopant element may have a high solubility in the material of the elongated nanostructure. Most preferably, the solubility of the at least one dopant element may be in the order of a solubility of $10^{19}$ atoms/cm$^3$ or higher, preferably a solubility of $10^{20}$ atoms/cm$^3$ or higher and most preferably a solubility of $10^{21}$ atoms/cm$^3$ or higher.

The catalyst compound does preferably not or not significantly dissolve in the material the elongated nanostructure is formed of. Therefore, the catalyst compound may preferably have a solubility of $10^{18}$ atoms/cm$^3$ or lower, more preferably a solubility of $10^{16}$ atoms/cm$^3$ or lower, still more preferably a solubility of $10^{14}$ atoms/cm$^3$ and most preferably a solubility of $10^{12}$ atoms/cm$^3$ or lower.

The catalyst compound may form the main compound of the catalyst nanoparticle and may form between 90% and 95% of the catalyst particle. The at least one dopant element may form the minor compound of the catalyst particle and may form between 5% and 10% of the catalyst particle. The ratio between the catalyst compound and the at least one dopant element depends on the solubility of the at least one dopant element and on the required dopant element concentration in the resulting elongated nanostructure.

Figure 5A:
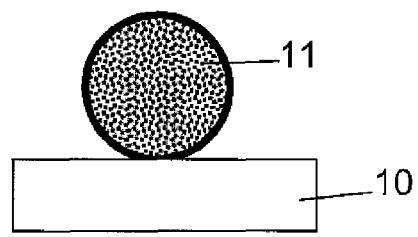
FIG. 5A to FIG. 5C schematically illustrate different processing steps in a method according to preferred embodiments.
Figure 5B:
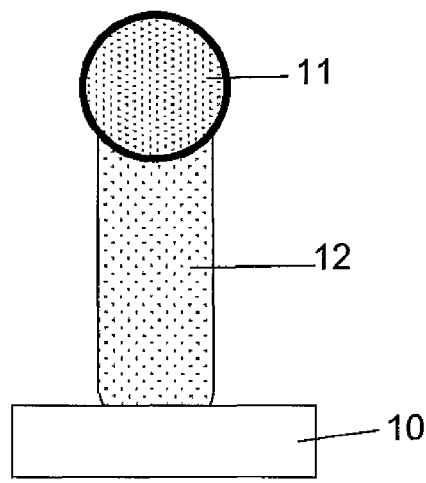
Figure 5C:
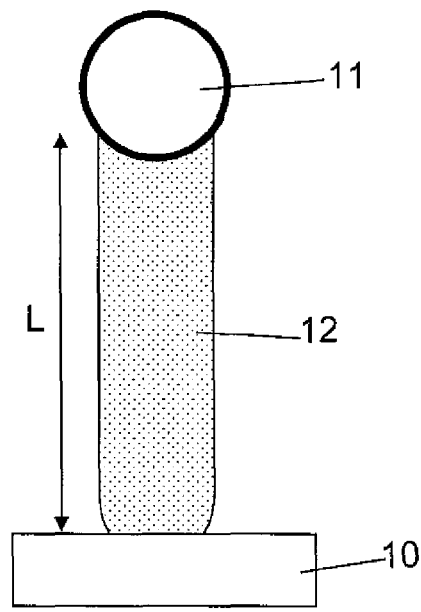

FIGS. 5A-5C schematically illustrate different processing steps in the method according to a preferred embodiment using a catalyst particle 11 comprising a catalyst compound and at least one dopant element and whereby the at least one dopant element and the catalyst compound comprise different elements. The method starts with providing a substrate 10. Onto the substrate 10 catalyst particles 11 comprising a catalyst compound and at least one dopant element are formed or deposited, by any suitable method, as shown in FIG. 5A. The catalyst compound may comprise a material suitable to (chemically) initiate and/or catalyze Vapor Liquid Solid (VLS) growth of the elongated nanostructures. The at least one dopant element may be a suitable p-type or n-type dopant element to dope the elongated nanostructure during growth to make it suitable to be used in applications, e.g. in electronic devices. To obtain control on the doping and the growth processes at the same time, preferably the catalyst compound may be electrically neutral in the nanostructure material or may have the same doping characteristics (donor (n-type) or acceptor (p-type)) as the at least one dopant element. This is because, although according to preferred embodiments the catalyst compound does not significantly or not substantially dissolve in the nanostructure material, in some cases dissolvation of a few atoms of the catalyst compound in the nanostructure material may not be prevented. Nevertheless, this is not essential when the solubilities of the catalyst compound and the at least one dopant element differ by at least one order of magnitude. Therefore, according to most preferred embodiments, the catalyst compound may have a much lower solubility in the material the nanostructure is formed of than the at least one dopant element, the solubility of the catalyst compound being at least one order of magnitude lower than the solubility of the dopant element in the nanostructure material. For example, suitable dopant elements/catalyst compound combinations which can be used in a catalyst particle 11 according to preferred embodiments may be Sb/Bi, Ga/In, Al/In, P/In, and the like.

In a next step, as shown in FIG. 5B, a nanostructure 12 is grown, e.g. using the VLS growth technique. FIG. 5B illustrates an intermediate step in the method according to the present embodiment in which the elongated nanostructure 12 is not yet fully grown. In FIG. 5C a final, doped elongated nanostructure 12 is illustrated. In the final, doped elongated nanostructure 12 the at least one dopant element is substantially completely dissolved into the elongated nanostructure 12 and the catalyst compound is not dissolved or at least not significantly dissolved in the elongated nanostructure 12. With substantially completely dissolved is meant that more than 90% of the at least one dopant element, preferably more than 95% of the at least one dopant element and more preferably more than 99% of the at least one dopant element is dissolved in the elongated nanostructure 12 obtained. With not dissolved or at least not significantly dissolved is meant that most of the catalyst compound may, after growth of the elongated nanostructure 12 is finished, be still present on top of the elongated nanostructure as can be seen from FIG. 5C.

According to the present embodiment, the dopant concentration level of the elongated nanostructure 12 may be determined by the initial amount or concentration of the at least one dopant element in the catalyst particle 11. Furthermore, the dopant concentration level of the elongated nanostructure 12 may also depend on the solubility of the at least one dopant elements and, in some cases, on the temperature, as was already discussed above.

The length L of the elongated nanostructure 12 obtained after growth may depend on the growth rate and on the growth time. The length L of the elongated nanostructure may depend on the type of nanostructure 12 and on the application the nanostructure 12 is to be used for. Preferably the length L may be between 100 nm and 20 µm.

The method according to preferred embodiments may ensure a continuous growth of the nanostructure 12 with a constant diameter. This is because of the substantially non-solubility of the main catalyst compound in the catalyst particle 11. The diameter of the elongated nanostructure 12 formed depends on and is controlled by the size of the catalyst particle 11. If the catalyst particle 11 would dissolve in the nanostructure 12 during growth, its size would consequently decrease and thus the diameter of the elongated nanostructure 12 formed would not be constant as it will decrease during growth. However, according to preferred embodiments, the size of the catalyst nanoparticle 11 is determined by the main catalyst compound and, because the catalyst compound does not dissolve at all, or does not significantly dissolve in the nanostructure material during growth, the size of the catalyst nanoparticle may stay substantially the same during growth of the nanostructure. Therefore, elongated nanostructures 12 with a substantially constant diameter may be obtained by the method according to preferred embodiments.

The catalyst compound and the at least one dopant element of the catalyst nanoparticle 11 and the nanostructure material used to grow the nanostructure 12 may preferably have a low eutectic temperature of 600° C. or lower. The eutectic temperature is the lowest temperature at which the catalyst particle comprising the catalyst compound and the at least one dopant element, once alloyed with the nanostructure material, e.g. silicon, can exist in a liquid form. Often the eutectic temperature is much lower than the melting temperature of the single elements, i.e. the at least one element of main catalyst compound and the nanostructure material, e.g. silicon.

According to preferred embodiments, the elongated nanostructure 12 may be a nanowire, preferably a semiconductor nanowire. According to preferred embodiments, the semiconductor nanowire 12 may comprise a semiconductor material comprising at least one of group IV elements (such as Si, Ge) or a binary compound thereof (such as SiGe), a group III element (such as B, Al, Ga, In, Tl) or group V element (such as N, P, As, Sb) and binary, tertiary or quaternary compounds thereof, a group II element (such as Cd, Zn) or a group VI element (such as O, S, Se, Te) and binary, tertiary and quaternary compounds thereof.

According to most preferred embodiments, the semiconductor nanowire 12 may comprise a semiconductor material comprising at least one of silicon (Si), germanium (Ge) or silicon-germanium (SiGe). According to these preferred embodiments, to obtain a p-type nanowire 12, the at least one dopant element may be a p-type dopant element and may preferably comprise B, Al and Ga. The catalyst compound may be a suitable material to catalyze VLS growth such as e.g. In, Tl, Au, Zn and Bi.

According to a preferred example, the catalyst particle 11 may comprise an In—Ga alloy. These In—Ga alloys have been identified as good catalyst particles 11 for use with preferred embodiments for growing p-type doped nanostructures 12, such as e.g. Si nanowires, using the VLS growth technique. In these alloys, indium (In) may form the catalyst compound for catalyzing the nanostructure growth. In is characterized as a thermodynamically favorable catalyst for VLS growth with a low Si/In eutectic temperature of 157° C. and having a low solubility in Si of approximately $2 \times 10^{18}$ atoms/cm$^3$. Gallium (Ga) may form the dopant element and has a one order of magnitude higher solubility in Si than In, i.e. it has a solubility of approximately $2 \times 10^{19}$ atoms/cm$^3$.

According to the preferred embodiments according to which the nanostructure 12 may be a Si, Ge or SiGe semiconductor nanowire, an n-type nanowire 12 may be obtained by at least one dopant element comprising Li, Sb, P and As and the catalyst compound may be a suitable material to catalyze VLS growth such as In, Tl, Au, Zn and Bi.

For example, Bi—Sb alloys are identified as good catalyst nanoparticles 11 for growing n-type doped elongated nanostructures 12 such as e.g. Si nanowires, using the VLS growth technique. In these alloys bismuth (Bi) may form the catalyst compound and is characterized as a thermodynamically favorable catalyst for VLS growth with a low Si/Bi eutectic temperature of 271° C. and having a low solubility in Si of approximately $4 \times 10^{17}$ atoms/cm$^3$. Antimony (Sb) may form the dopant element and has a two orders of magnitude higher solubility in Si than Bi, i.e. it has a solubility in Si of approximately $4 \times 10^{19}$ at/cm$^3$.

The above-described examples of catalyst particle compositions in case of Si may also be used to grow Ge and SiGe nanowires 12 since the eutectic behavior and solubilities are similar for these semiconductor materials.

According to other embodiments, the elongated nanostructure 12 may be a nanowire formed of group III or group V materials or binary, tertiary or quaternary compounds thereof. To obtain p-type nanowires of these III and/or group V materials the at least one dopant element may comprise at Mg, Zn, Be, Sr, Ba or C and the catalyst compound may comprise a suitable material to catalyze VLS growth such as In, Tl, Co, Ni and Au.

To obtain an n-type nanostructure 12 comprising group III and/or group V materials the at least one dopant element may comprise Si, Sn, Ge, S and Te and the catalyst compound may be a suitable material to catalyze VLS growth such as In, Tl, Co, Ni and Au.

For example, so-called "soft gold" can be electroplated to obtain Au catalyst particles 11 that comprise sulfur (S) as an n-type dopant element for doping the nanostructures 12 during growth.

According to still further embodiments, the elongated nanostructure 12 may be a nanowire comprising a material selected from group III and/or group V materials or comprising a material selected from group II and/or group IV materials, and the catalyst compound may be equal to the compound used to grow the nanostructure 12. For example, In—P alloys can be used as catalyst particles 11 for growing p-doped In nanowires 12, in which In forms the catalyst compound and P forms the p-type dopant element.

According to other embodiments, silicon-metal alloys or silicides, germanium-metal alloys or germanides, carbon-metal alloys or carbides, sulfur-metal alloys or sulfides, selenium-metal alloys or selenides or tellurium-metal alloys or tellurides may be used in the catalyst particles 11 according to preferred embodiments as a source of Si, Ge, C, S, Se and Te dopants, respectively, for the elongated nanostructures 12 during growth.

According to preferred embodiments, the catalyst particles 11 comprising a catalyst compound and at least one dopant element as described above may be provided to the substrate 10 by, for example, deposition with electrochemical techniques.

According to preferred embodiments, the catalyst particles 11 may have a diameter of between 1 and 100 nm.

For many applications elongated nanostructures 12 may be required with dopants present only in certain parts or in different concentration along e.g. a length of the elongated nanostructure. Examples are highly-doped source-drain areas at both ends of an elongated nanostructure 12, e.g. nanowire, and an un-doped channel area in between the source-drain areas for use in semiconductor devices. Therefore, forming of nanostructures 12 having a dopant concentration profile or a variation of dopant concentration along e.g. a length of the nanostructure 12 may be interesting.

The method according to preferred embodiments, allows forming elongated nanostructures 12 having a dopant concentration profile or a variation in dopant concentration along the length of the nanostructure 12. This may be obtained by changing or varying a growth rate at which the elongated nanostructures 12 are grown during the growth process. The higher the growth rate, the higher the concentration of the dopant dissolved in the material of the nanostructure 12 will be (see below). The dopant concentration in the elongated nanostructure 12 can thus be controlled by changing or varying the growth rate of the nanostructure 12 or in other words by tuning the growth conditions in a chamber in which the nanostructures 12 are grown.

Figure 6:
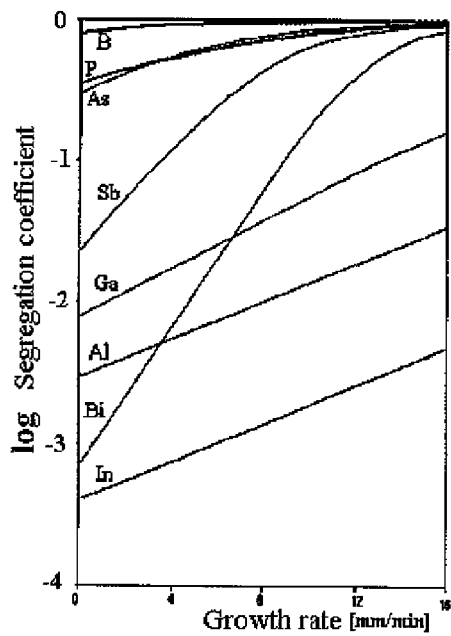
FIG. 6 illustrates segregation coefficients versus growth rate for different dopant elements and catalyst compounds in bulk crystalline silicon.

As an example FIG. 6 illustrates segregation coefficients versus growth rate for different dopant elements (B, Ga, Al, P, As) and catalyst compounds (Bi, In) in bulk crystalline silicon. The segregation coefficient can be defined as the concentration of the compound in the solid state (in FIG. 7 bulk silicon) divided by the concentration of the compound in liquid state. The segregation coefficient thus defines the solubility of a given element, in the example given dopant elements B, Ga, Al, P and As and catalyst compounds Bi and In, in a material, in the example given bulk crystalline silicon. The values in FIG. 6 are valid for growth of bulk silicon and are only given to indicate that the segregation of these compounds increases when the growth rate increases.

According to preferred embodiments, combination of the choice in the dopant element used and control of the growth rate may define the dopant concentration profile in the elongated nanostructure 12 obtained after growth. For example, the segregation coefficient of antimony (Sb), which may be used as a dopant element according to preferred embodiments, in silicon is one of the graphs illustrated in FIG. 6. According to this particular example, a catalyst particle 11 comprising Sb as dopant element may lead to a nanostructure 12 having a high Sb concentration of about $10^{20}$ atoms/cm$^3$ for high nanowire growth rate, e.g. growth rates between 10 and 16 mm/min and a lower Sb concentration may be obtained for slower nanowire growth, e.g. at growth rates of between 0 and 2 mm/min. For example, to form Si nanowires 12 suitable for being used for forming highly-doped source and drain regions with a lowly-doped channel in between, growth of the Si nanowire 12 using Sb as a dopant element may be performed at high growth rates of between 10 and 16 mm/min at the start, at low growth rates of between 0 and 2 mm/min for forming the middle or channel part of the nanowire 12 and again at high growth rates of between 10 and 16 mm/min at the end. This illustrates how, during VLS growth, doping of the nanostructures 12 can be controlled by tuning, changing or varying the growth rate. Tuning, changing or varying the growth rate can be done by tuning growth parameters such as temperature and/or gas flow of nanostructure material during the growth process.

Hereinafter a simulation will be given for the calculation of a required dopant concentration in an elongated nanostructure 12 versus dopant concentration needed in the catalyst particle 11 using catalyst leaching to obtain such required dopant concentration.

In a first step, calculation of the required concentration of dopant element in the catalyst particle 11 was performed. For example, in semiconductor devices dopant concentration may typically range from $10^{12}$ atoms/cm$^3$ up to $10^{17}$ atoms/cm$^3$. An elongated nanostructure 12, e.g. nanowire, used in semiconductor applications may typically have a diameter of around 50 nm, or a radius of 25 nm ($25\times10^{-7}$ cm), and a length of around 500 nm ($5\times10^{-5}$ cm), which results in a volume of the elongated nanostructure 12, e.g. nanowire, in the order of $10^{-15}$ cm$^3$.

To obtain dopant concentrations e.g. in the range of $10^{15}$ atoms/cm$^3$ up to $10^{17}$ atoms/cm$^3$ only a limited amount, i.e. between 1 and 100 atoms, of dopant element are needed in the catalyst particle 11. Such low dopant concentrations in the elongated nanostructure 12, e.g. nanowire, are impossible to achieve with prior art techniques such as e.g. implantations.

Hence, according to preferred embodiments, elongated nanostructures 12 with dopant concentrations as high as the solubility of the at least one dopant element can be obtained. For example, for As and P as dopant elements a dopant concentration of about $10^{21}$ atoms/cm$^3$ can be obtained. Furthermore, the catalyst particles 11 and the method according to preferred embodiments can also be used for forming elongated nanostructure 12 with a dopant concentration of lower than $10^{17}$ atoms/cm$^3$, for example with a dopant concentration of between $10^{14}$ atoms/cm$^3$ and $10^{16}$ atoms/cm$^3$. The required dopant concentration in the elongated nanostructures 12 formed depends on the intended application of the nanostructure 12 and, for example, electronic devices to be formed. For example, for Si in planar device technologies $10^{19}$ atoms/cm$^3$ are considered high dopant levels whereas low dopant levels are between $10^{14}$ atoms/cm$^3$ and $10^{16}$ atoms/cm$^3$.

It has to be taken into account that the material volume of the nanostructure 12 is limited. For a hypothetical nanostructure 12 e.g. nanowire, with a diameter of 50 nm and a height of 100 nm, a high dopant concentration of $10^{19}$ atoms/cm$^3$ may require $2.10^3$ atoms/wire whereas a low dopant concentration of $10^{16}$ atoms/cm$^3$ may require only 2 atoms/wire.

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method for forming at least one doped elongated nanostructure on a substrate, the method consisting of:
   providing a gaseous source of nanostructure material;
   providing at least one catalyst particle on a substrate, the catalyst particle consisting of a catalyst compound and at least one dopant element, wherein the catalyst compound comprises at least one catalyst element, and wherein the catalyst element and the dopant element are different elements; and thereafter
   growing at least one elongated nanostructure comprising the nanostructure material between the catalyst particle and the substrate, wherein the catalyst compound catalyzes growth of the elongated nanostructure without substantially dissolving in the nanostructure material, wherein the dopant element dopes the elongated nanostructure during growth by substantially completely dissolving in the nanostructure material, wherein a dopant element concentration in the doped elongated nanostructure is lower than $10^{17}$ atoms/cm$^3$, and wherein the doped elongated nanostructure material contains less than 1% of the catalyst compound.

2. The method according to claim 1, wherein the catalyst particle comprises more than one dopant element.

3. The method according to claim 1, wherein the catalyst compound comprises at least one catalyst element selected from the group consisting of In, Tl, Au, Zn, Te, Bi, Al, Ga, Co, and Ni.

4. The method according to claim 1, wherein the dopant element is a p-type dopant element.

5. The method according to claim 4, wherein the p-type dopant element comprises at least one element selected from the group consisting of B, Al, Ga, Mg, Zn, Be, Sr, Ba, and C.

6. The method according to claim 1, wherein the dopant element is an n-type dopant element.

7. The method according to claim 6, wherein the n-type dopant element comprises at least one element selected from the group consisting of Li, Sb, P, As, Si, Ge, S, Sn, and Te.

8. The method according to claim 1, wherein the elongated nanostructure is formed of a nanostructure material, and wherein the catalyst compound has a solubility in the nanostructure material of $10^{18}$ atoms/cm$^3$ or lower.

9. The method according to claim 1, wherein the elongated nanostructure is formed of a nanostructure material, and wherein the dopant element has a solubility in the nanostructure material of at least $10^{19}$ atoms/cm$^3$.

10. The method according to claim 1, wherein the elongated nanostructure is formed of a nanostructure material, and wherein the catalyst compound comprises at least one element native to the nanostructure material.

11. The method according to claim 1, wherein growing the elongated nanostructure is performed at a growth rate, and wherein the method further comprises a step of changing the growth rate of the elongated nanostructure during growth.

12. The method according to claim 1, wherein the elongated nanostructure is a nanowire.

13. The method according to claim 12, wherein the nanowire is a semiconductor nanowire.

14. The method according to claim 13, wherein the semiconductor nanowire comprises at least one element selected from the group consisting of a group IV element, a binary compound of a group IV element, a group III element, a binary compound of a group III element, a tertiary compound of a group III element, a quaternary compound of a group III element, a group V element, a binary compound of a group V element, a tertiary compound of a group V element, a quaternary compound of a group V element, a group II element, a binary compound of a group II element, a tertiary compound of a group II element, a quaternary compound of a group II element, a group VI element, a binary compound of a group VI element, a tertiary compound of a group VI element, and a quaternary compound of a group VI element.

15. The method according to claim 14, wherein the semiconductor nanowire comprises a material selected from the group consisting of Si, Ge, and SiGe.

16. The method according to claim 1, wherein the doped elongated nanostructure has a length, and wherein the doped elongated nanostructure exhibits a variation of dopant concentration along its length.

17. The method according to claim 1, wherein the catalyst compound, the at least one dopant element and the nanostructure material have a eutectic temperature of 600° C. or lower.

18. The method according to claim 1, wherein the catalyst compound, the at least one dopant element and the nanostructure material form a eutectic alloy from which the at least one elongated nanostructure is grown.

19. The method according to claim 1, wherein the at least one dopant element is configured for homogenously doping the elongated nanostructure, wherein the dopant element has no influence on physical properties of the elongated nanostructure.

20. The method according to claim 1, wherein from 5% to 10% of the catalyst particle is the dopant element.

21. The method according to claim 1, wherein the p-type dopant element is selected from the group consisting of B, Al, Ga, Mg, Zn, Be, Sr, and Ba, and wherein the n-type dopant element is selected from the group consisting of Li, Sb, P, As, Si, Ge, S, Sn, and Te.

22. The method according to claim 1, wherein the semiconductor material is a group IV element.

23. The method according to claim 1, wherein the elongated nanostructure is a semiconductor nanowire grown by Vapor Liquid Solid growth, wherein the dopant element is an n-type dopant or a p-type dopant, wherein solubilities of the catalyst compound and the dopant element differ by at least one order of magnitude, wherein a size of the catalyst particle stays substantially the same during growth of the semiconductor nanowire and corresponding depletion of dopant element in the catalyst particle, and wherein the catalyst particle depleted of dopant element is present on top of the semiconductor nanowire.

24. The method according to claim 23, wherein a length of the semiconductor nanowire, as measured from the substrate to the catalyst particle depleted of dopant element, is from 100 nm to 20 μm.

25. The method according to claim 24, wherein a diameter of the semiconductor nanowire is substantially constant.

26. The method according to claim 24, wherein a diameter of the semiconductor nanowire is constant.

27. The method according to claim 23, wherein the elongated nanostructure is a silicon nanowire, wherein the gaseous source is silane, wherein dissociation of the silane to yield silicon is catalyzed by the catalyst particle, wherein silicon associates with the catalyst particle to yield a eutectic alloy in liquid form, and wherein the silicon is precipitated to form the silicon nanowire.

28. The method according to claim 1, conducted in an absence of gas-phase dopants.

29. The method according to claim 1, wherein a dopant concentration of the elongated nanostructure is controlled throughout the elongated nanostructure to yield a predetermined a dopant concentration profile or a predetermined variation of dopant concentration along a length of the elongated nanostructure.

30. The method according to claim 1, wherein the elongated nanostructure is uniformly doped.

31. The method according to claim 1, wherein the dopant element has no influence on physical properties of the elongated nanostructure.

32. The method according to claim 31, wherein the dopant element has no influence on diameter of the elongated nanostructure.

* * * * *